United States Patent
Walke et al.

(10) Patent No.: US 11,322,390 B2
(45) Date of Patent: May 3, 2022

(54) COINTEGRATION OF GALLIUM NITRIDE AND SILICON

(71) Applicant: IMEC vzw, Leuven (BE)

(72) Inventors: Amey Mahadev Walke, Heverlee (BE); Niamh Waldron, Heverlee (BE); Nadine Collaert, Blanden (BE); Ming Zhao, Bertem (BE)

(73) Assignee: IMEC vzw, Leuven (BE)

( * ) Notice: Subject to any disclaimer, the term of this patent is extended or adjusted under 35 U.S.C. 154(b) by 58 days.

(21) Appl. No.: 16/844,845

(22) Filed: Apr. 9, 2020

(65) Prior Publication Data

US 2020/0328108 A1 Oct. 15, 2020

(30) Foreign Application Priority Data

Apr. 10, 2019 (EP) .................................... 19168401

(51) Int. Cl.
*H01L 25/16* (2006.01)
*H01L 21/762* (2006.01)
(Continued)

(52) U.S. Cl.
CPC ........ *H01L 21/76256* (2013.01); *H01L 25/16* (2013.01); *H01L 29/66462* (2013.01); (Continued)

(58) Field of Classification Search
CPC .................................................... H01L 21/187
See application file for complete search history.

(56) References Cited

U.S. PATENT DOCUMENTS

| 6,455,398 | B1 * | 9/2002 | Fonstad, Jr. | ......... | G02B 6/1245 |
| | | | | | 257/E21.088 |
| 7,420,226 | B2 | 9/2008 | Augustine et al. | | |

(Continued)

OTHER PUBLICATIONS

Chung et al. "GaN-on-Si Technology, a New Approach for Advanced Devices in Energy and Communications", Proceedings of the European Solid-State Device Research Conference 2010 (ESSDERC), pp. 52-56, © Copyright 2010 IEEE.
(Continued)

*Primary Examiner* — Fernando L Toledo
*Assistant Examiner* — Valerie N Newton
(74) *Attorney, Agent, or Firm* — Knobbe Martens Olson & Bear, LLP (57) ABSTRACT

The disclosed technology relates generally to the field of semiconductor devices, and more particularly to co-integration of GaN-based devices with Si-based devices. In one aspect, a method of forming a semiconductor device includes forming a first wafer including, on a front side thereof, a III-V semiconductor layer stack formed on a first substrate and a first bonding layer. The III-V semiconductor layer stack includes a GaN-based device layer structure formed on the first substrate. The method additionally includes, subsequent to forming the first wafer, bonding the first bonding layer to a second bonding layer of a second wafer. The second wafer includes a second silicon substrate supporting an active device layer, a back-end-of-line interconnect structure and the second bonding layer. The method further comprises, subsequent to bonding, thinning the first wafer from a backside, wherein thinning includes removing at least the first substrate. In another aspect, a semiconductor device includes a cointegrated N-polar HEMT.

15 Claims, 4 Drawing Sheets

(51) Int. Cl.
  *H01L 29/66* (2006.01)
  *H01L 29/778* (2006.01)
  *H01L 29/20* (2006.01)
  *H01L 29/205* (2006.01)
  *H01L 29/423* (2006.01)

(52) U.S. Cl.
  CPC ...... *H01L 29/7786* (2013.01); *H01L 29/2003* (2013.01); *H01L 29/205* (2013.01); *H01L 29/4236* (2013.01)

(56) References Cited

U.S. PATENT DOCUMENTS

| | | | |
|---|---|---|---|
| 9,660,069 | B2 | 5/2017 | Bayram et al. |
| 2010/0301347 | A1 | 12/2010 | Chung et al. |
| 2015/0311142 | A1 | 10/2015 | Sekar et al. |
| 2017/0110448 | A1* | 4/2017 | Prechtl .............. H01L 29/42316 |
| 2017/0365667 | A1 | 12/2017 | Sato |
| 2019/0096916 | A1 | 3/2019 | Czornomaz et al. |

OTHER PUBLICATIONS

Hoke et al., "Monolithic integration of silicon CMOS and GaN transistors in a current mirror circuit", J. Vac. Sci. Technol. B 30(2), Mar./Apr. 2012, pp. 02B101-1-02B101-6.

Lee et al., "GaN Devices on a 200 mm Si Platform Targeting Heterogeneous Integration", IEEE Electron Device Letters, vol. 38, No. 8, Aug. 2017.

Lee et al., "Monolithic Integration of Si-CMOS and III-V-on-Si Through Direct Wafer Bonding Process", Journal of the Electron Devices Society, vol. 6, 2018, pp. 571-578.

Koksaldi et al., "N-Polar GaN HEMTs Exhibiting Record Breakdown Voltage Over 2000 V and Low Dynamic On-Resistance", IEEE Electron Device Letters, vol. 39, No. 7, Jul. 2018.

Rajan et al. "N-Polar GaN/AlGaN/GaN high electron mobility transistors", Journal of Applied Physics 102, 044501 (2007); https://doi.org/10.1063/1.2769950.

Extended European Search Report in application EP 21105723 dated Sep. 25, 2019.

* cited by examiner

COINTEGRATION OF GALLIUM NITRIDE AND SILICON

CROSS-REFERENCE TO RELATED APPLICATIONS

This application claims foreign priority to European Patent Application No. EP 19168401.8, filed Apr. 10, 2019, the content of which is incorporated by reference herein in its entirety.

BACKGROUND

Field

The disclosed technology relates generally to the field of semiconductor devices, and more particularly to co-integration of GaN-based devices with Si-based devices.

Description of the Related Technology

Owing to a higher bandgap and two-dimensional electron gas (2 DEG) electron mobility, GaN-based high-electron mobility transistors (HEMTs) may be more suitable for e.g., high power and high frequency applications compared to their Si-based counterparts based on complementary metal oxide semiconductor (CMOS) technology. Stand-alone GaN integrated circuits operating in the millimeter-wave range are, however, typically fabricated on non-Si substrates such as SiC substrates. Such substrates can be smaller in size, and more expensive, compared to Si substrates, and such millimeter-wave range circuits often use passive components such as resistors, inductors, and capacitors for their design. It may, therefore, be desirable to combine the use of, e.g., CMOS transistors along with GaN-based devices in order to provide additional functionality. Examples include, e.g., smart biasing circuits which may be implemented for a better power efficiency optimization.

However, cointegration of GaN with Si CMOS devices may be challenging and time-consuming due to, e.g., a large mismatch of lattice constants and complex integration schemes.

SUMMARY OF CERTAIN INVENTIVE ASPECTS

An object of the disclosed technology is therefore to provide an improved way of integrating GaN-based devices such as HEMTs together with Si CMOS devices (such as CMOS transistors). To at least partly achieve this goal, the disclosed technology provides a method of forming a semiconductor device, and a semiconductor device, as defined in the independent claims. Further embodiments of the method and device are provided in the dependent claims.

According to a first aspect of the disclosed technology, a method of forming a semiconductor device is provided. The method may include forming a first wafer including, on a front side, a III-V semiconductor layer stack on a first substrate and a first bonding layer. The III-V semiconductor layer stack may include a GaN-based device layer structure and be epitaxially grown on the first substrate. The method may include, subsequent to forming the first wafer, bonding the first bonding layer to a second bonding layer of a second wafer. The second wafer may include a second substrate supporting an active device layer, a (back-end of line) BEOL interconnect structure and the second bonding layer. The second substrate may, e.g., be a Si substrate. The method may further include, subsequent to the bonding, thinning the first wafer from a backside (i.e., from a side opposite the front side, which may include, e.g., the III-V semiconductor layer stack that may have been grown thereon), including removing at least the first substrate. The first substrate may, e.g., be a Si substrate, which may be cheaper and/or provided having a larger area than, e.g., a SiC substrate.

The disclosed technology thereby provides a way of integrating a GaN-based device layer structure with an active device layer (e.g., a CMOS transistor) on a Si substrate by only a single bonding and a single wafer thinning step. The use of, e.g., temporary bonding and debonding steps are not required. The disclosed technology provides a way of integrating high density CMOS devices with low density (e.g., large area) GaN-based devices, and to separate the device into different layers. For example, the active device (e.g., the CMOS device) may be used for digital processing as well as to, e.g., provide biasing for the GaN-based devices. Since the III-V semiconductor layer stack is epitaxially grown on the first substrate and the first wafer subsequently is thinned from the backside the method may provide an N-polar GaN-based device layer structure.

In some embodiments, the III-V semiconductor layer stack may include a buffer layer structure between the first substrate and the GaN-based device layer structure. The thinning may include removing the buffer layer structure.

In some embodiments, the III-V semiconductor layer stack may include one or more etch stop layers between the buffer layer structure and the GaN-based device layer structure.

In some embodiments, the method may include, subsequent to the thinning, processing the GaN-based device layer structure to form a transistor device. The transistor device may for example be a HEMT or a MOSHEMT transistor. As may be understood from the above, the transistor device may be an N-polar transistor device.

In some embodiments, the GaN-based device layer structure may include a GaN channel layer. The thinning may include exposing the GaN channel layer.

In some embodiments, the first wafer may include a barrier layer structure between the GaN channel layer and the first bonding layer. The barrier layer structure may include at least an AlGaN layer or an InAlN layer.

In some embodiments, the first wafer may include a stress layer structure between the barrier layer structure and the first bonding layer. The stress layer structure may include a GaN layer.

In some embodiments, the GaN-based device layer structure may include a doped source-drain contacting layer in contact with the GaN channel layer. That is, the GaN channel layer may be epitaxially grown on (a surface of) the doped source-drain contacting layer. The thinning may include exposing the contacting layer, and to not expose the then underlying GaN channel layer.

In some embodiments, the first wafer may include a metal layer between the GaN-based device layer structure and the first bonding layer, and an electrically insulating layer (such as, e.g., an oxide or nitride) between the metal layer and the GaN-based device layer structure. The metal layer may for example serve as a heat redistribution layer. Such a layer may, e.g., serve to remove heat generated by, e.g., the GaN-based device.

In some embodiments, the method may include forming, subsequent to the bonding, one or more thermal (metal) vias connecting to the metal layer. Such vias may further help to remove heat taken up by the heat redistribution layer and to move such heat to, e.g., an outside of the device layer structure.

In some embodiments, the method may include, subsequent to the bonding, forming one or more (metal) vias connecting to the BEOL interconnect structure (of the active device originally provide on the second wafer). Such vias may be for electrical connections, but also serve, e.g., to remove heat.

According to a second aspect of the disclosed technology, a semiconductor device is provided. The device may include a Si substrate. The device may include an active device layer formed on the substrate (including, e.g., a CMOS transistor or similar). The device may include a BEOL interconnect structure formed on the active device layer (to, e.g., electrically contact the active device). The device may further include an N-polar HEMT bonded via a bonding stack to the interconnect structure. The N-polar HEMT may include an N-polar GaN channel. The production of such a device may include performing the steps of the method according to the first aspect.

In some embodiments, the device may further include a stress layer structure arranged between the GaN channel and the bonding stack. The stress layer structure may include a GaN layer.

In some embodiments, the device may further include a doped source-drain contacting layer in contact with the GaN channel.

In some embodiments, the device may further include a metal layer between the bonding stack and the HEMT, and an electrically insulating layer between the metal layer and the HEMT.

In some embodiments, the HEMT may be a metal-oxide-semiconductor (MOS) HEMT (i.e., a MOSHEMT).

In some embodiments, a gate of the HEMT may be recessed into the GaN channel.

The disclosed technology relates to all possible combinations of features recited in the claims. Further, any embodiment described with reference to the method according to the first aspect may be combinable with any of the embodiments described with reference to the circuit according to the second aspect, and vice versa. For example, a description of a feature of a method according to the first aspect (such as for example a description of a certain device, certain layer, or some other structure) may apply also to a corresponding similar or same feature of the device according to the second aspect, or vice versa.

Further objects and advantages of the various embodiments of the disclosed technology will be described below by means of exemplifying embodiments.

BRIEF DESCRIPTION OF THE DRAWINGS

Exemplifying embodiments will be described below with reference to the accompanying drawings, in which.

In the drawings, like reference numerals will be used for like elements unless stated otherwise. Unless explicitly stated to the contrary, the drawings show only such elements that are necessary to illustrate the example embodiments, while other elements, in the interest of clarity, may be omitted or merely suggested. As illustrated in the figures, the sizes of elements and regions may not necessarily be drawn to scale and may, e.g., be exaggerated for illustrative purposes and, thus, are provided to illustrate the general structures of the embodiments.

DETAILED DESCRIPTION OF CERTAIN ILLUSTRATIVE EMBODIMENTS

Exemplifying embodiments will now be described more fully hereinafter with reference to the accompanying drawings. The drawings show currently preferred embodiments, but the invention may, however, be embodied in many different forms and should not be construed as limited to the embodiments set forth herein; rather, these embodiments are provided for thoroughness and completeness, and fully convey the scope of the disclosed technology to the skilled person.

With reference to FIGS. 1a to 1g, flows according to various embodiments of a method of forming a semiconductor device will now be described in more detail.

Figure 1A:
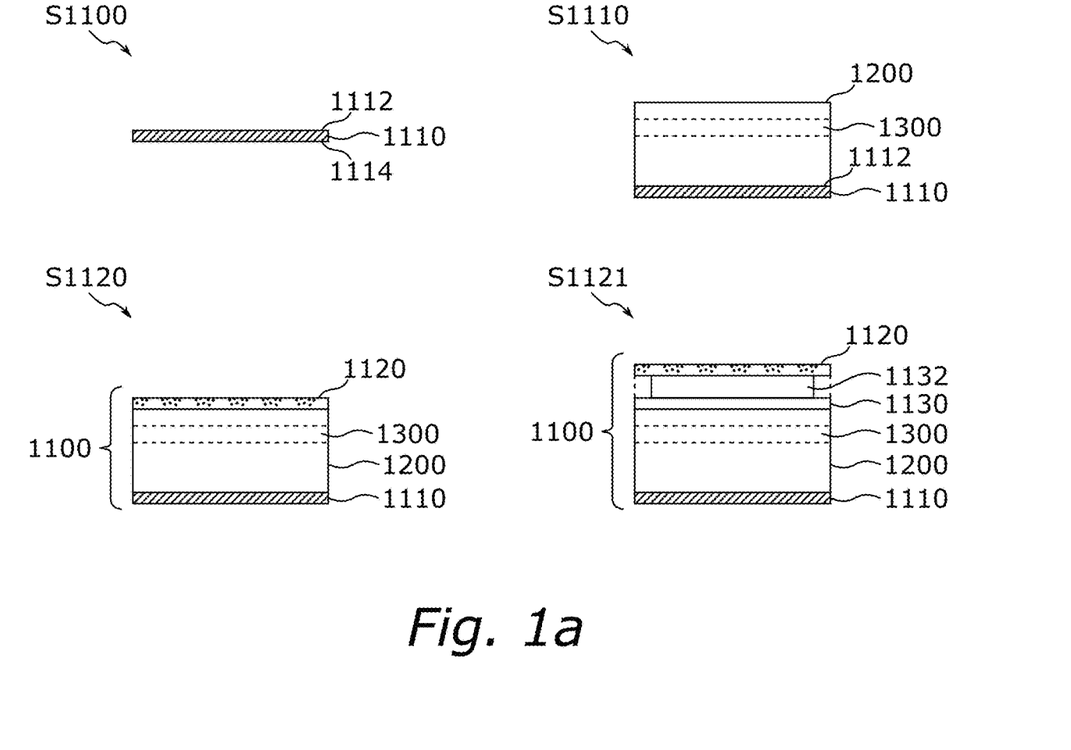
FIGS. 1a to 1g schematically illustrate intermediate structures at various stages of a flow or flows for fabricating a semiconductor device, according to various embodiments according to the disclosed technology, and FIGS. 2a and 2b schematically illustrate various embodiments of a device according to the disclosed technology.

FIG. 1a illustrates schematically a first step of forming a first wafer 1100. In a first substep S1100, a first substrate 1110 is provided. The first substrate 1110 has a front side 1112 and a backside 1114. The first substrate 1110 may, for example, be a Si substrate. The front side 1112 of the first substrate 1110 may, for example, have a surface having a (111) crystal plane. The backside 1114 of the first substrate 1110 may serve as a backside of the first wafer 1100.

In a second substep S1110 of the step of forming the first wafer 1100, a III-V semiconductor layer stack 1200 is grown on the front side 1112 of the first substrate 1110. The growth may, for example, be an epitaxial growth. Exemplary epitaxial growth processes for growing the III-layers may include vapor phase deposition such as metal-organic chemical vapor deposition (MOCVD), molecular beam epitaxy (MBE) or physical vapor deposition (PVD). The III-V semiconductor layer stack 1200 includes a GaN-based device layer structure 1300. The III-V semiconductor layer stack 1200 may, for example, include a plurality of layers of various III-N materials.

In a first alternative third substep S1120 of the step of forming the first wafer 1100, a first bonding layer 1120 is provided on top of the III-V semiconductor layer stack 1200.

In a second alternative third substep S1121 of the step of forming the first wafer 1100, an electrically insulating layer 1130 and a metal layer 1132 are provided on the III-V semiconductor layer stack 1200 before the first bonding layer 1120 is added. It is envisaged that the metal layer 1132, if provided, may be further shaped (e.g., by removal of some parts of the metal layer 1132) to allow for, e.g., vias to pass therethrough. The metal layer 1132 may, for example, serve as a heat redistribution layer. The metal layer 1132 may also function as a shield layer to reduce, e.g., cross talk between layers above the metal layer 1132 and layers below the metal layer 1132. The electrically insulating layer 1130 may, for example, be a protection oxide/nitride. It is envisaged that a thickness of the layer 1130 may be such that it is thick enough to provide less parasitic capacitance, but thin enough to take heat out from the GaN-based device layer structure 1300 and transfer this heat to the metal layer 1132 for further transport.

After the first bonding layer 1120 has been provided, it is envisaged that the first bonding layer 1120 may be planarized using a suitable planarization process, e.g., chemical-mechanical polishing (CMP) or a comparable planarization process.

Figure 1B:
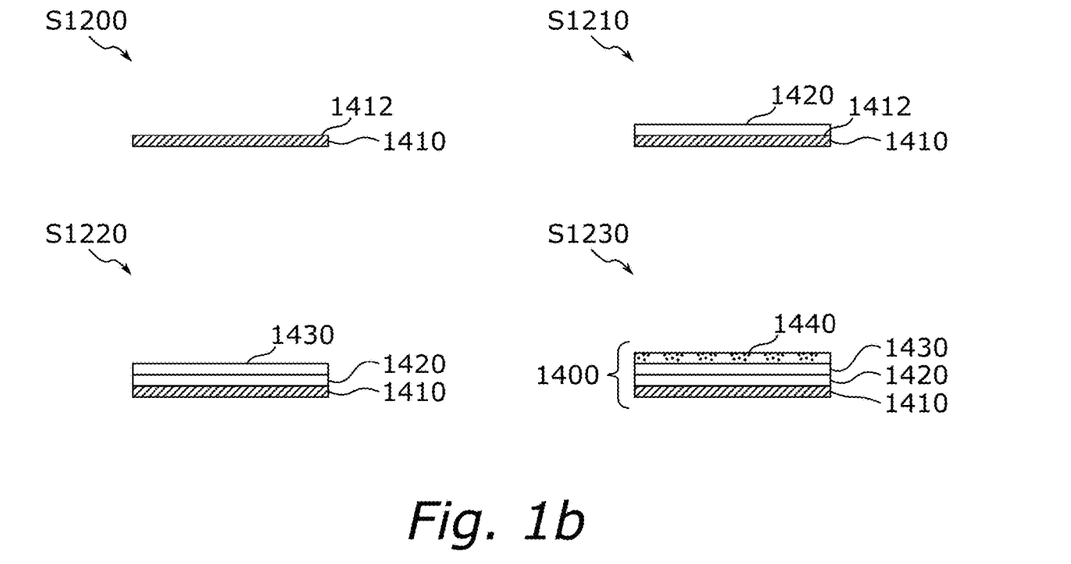

FIG. 1b illustrates schematically a step of forming a second wafer 1400. In a first substep S1200 of this step, a second substrate 1410 is provided. The second substrate 1410 is preferably a Si substrate. A side 1412 of the second substrate 1410 may for example be a Si(100) face.

In a second substep S1210 of the step of forming the second wafer 1400, an active device layer 1420 (e.g., a CMOS device layer) is provided/supported on the side 1412 of the second substrate 1410.

In a third substep S1220 of the step of forming the second wafer 1400, a back-end of line (BEOL) interconnect structure 1430 is provided on the active device layer 1420. The BEOL interconnect structure 1430 may provide, e.g., contacts, routings and other interconnect features for electrically connecting an active device (e.g., a CMOS transistor) formed in the active device layer 1420 to function properly. Although the structure 1430 is illustrated as a layer on top of the active device layer 1420, examples are not so limited and in other implementations, the structure 1430 may extend, e.g., into the active device layer 1420 as needed (not shown).

In a fourth substep S1230 of the step of forming the second wafer 1400, a second bonding layer 1440 is provided on the active device layer 1420 and the BEOL interconnect structure 1430. After the second bonding layer 1440 has been provided, the second bonding layer 1440 may be planarized using, e.g., CMP or a comparable planarization process.

It is envisaged that the method of the disclosed technology may include forming of the second wafer as described herein. It is also envisaged, in some embodiments, that the second wafer is already provided, and for example bought from a manufacturer or similar. In some embodiments, the second wafer so obtained may be without, e.g., the second bonding layer. It is then envisaged that the method may include receiving the second wafer without the second bonding layer, and to add the second bonding layer in order to complete the second wafer.

Figure 1C:
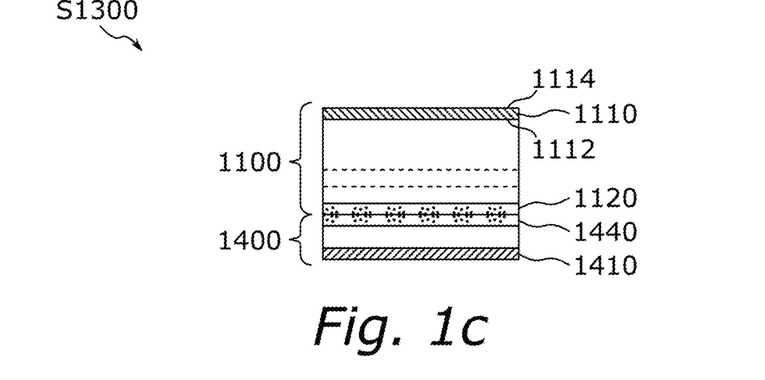

FIG. 1c illustrates schematically a step S1300, wherein the first wafer 1100 is bonded to the second wafer 1400. In the bonding process, the first bonding layer 1120 of the first wafer 1100 is aligned faced to face with, and bonded to, the second bonding layer 1440 of the second wafer 1400. The step S1300 of bonding is performed subsequent to forming of the first wafer and forming of the second wafer.

The first bonding layer 1120 and the second bonding layer 1440 may, for instance, be oxide layers, allowing oxide-oxide bonding, or nitride layers, allowing nitride-nitride bonding. However, it is envisaged that also other conventional wafer bonding techniques may be used such as by adhesive bonding layers, etc.

Figure 1D:
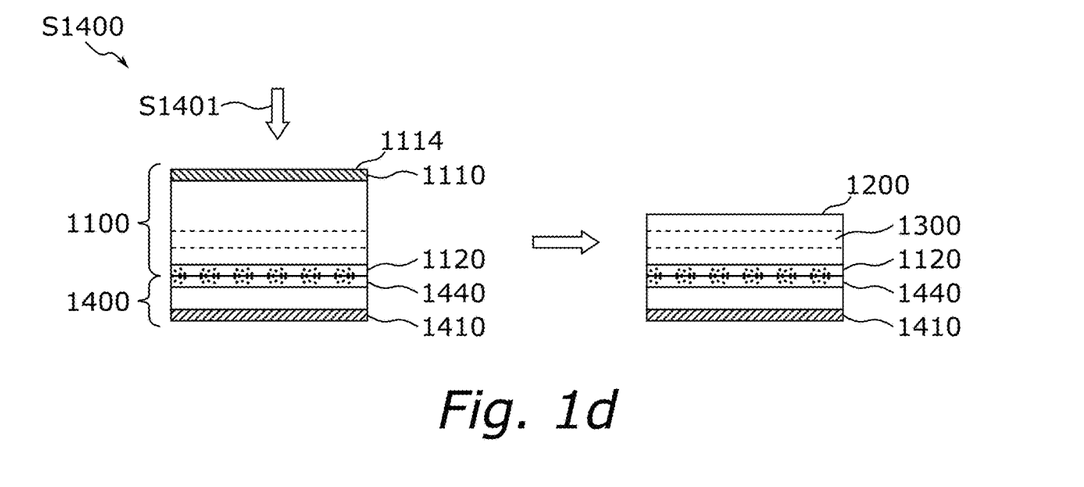

FIG. 1d illustrates schematically a step S1400, wherein a thinning of the first wafer 1100 is performed. The thinning (as indicated by the arrow S1401) is done from the backside 1114 of the first wafer 1100 (i.e., the backside 1114 of the first substrate 1110), and includes removing at least the first substrate 1110. Phrased differently, in the step S1400, the first substrate 1100 is removed such that the III-V semiconductor layer stack (structure) 1200 is exposed. It is envisaged (but not shown in FIG. 1d) that the thinning S1401 may include removing also part of the II-V semiconductor layer stack 1200, thereby exposing a surface of the GaN-based device layer structure 1300. The thinning S1401 in the step S1400 is performed subsequently to the bonding in step S1300.

After having performed the thinning in step S1400, the method according to the disclosed technology has thereby provided a GaN-based device layer structure and an active device layer (e.g., a CMOS transistor layer) provided on a same substrate (the second Si substrate of the second wafer). The bonded structure formed using a single bonding step, and without the use of additional wafers and/or substrates used to for example temporarily carry one or more layers. The method may therefore provide a more convenient, more cost-effective and less error-prone way of cointegrating GaN-based devices with, e.g., devices built on CMOS technology and on, e.g., Si substrates.

Figure 1E:
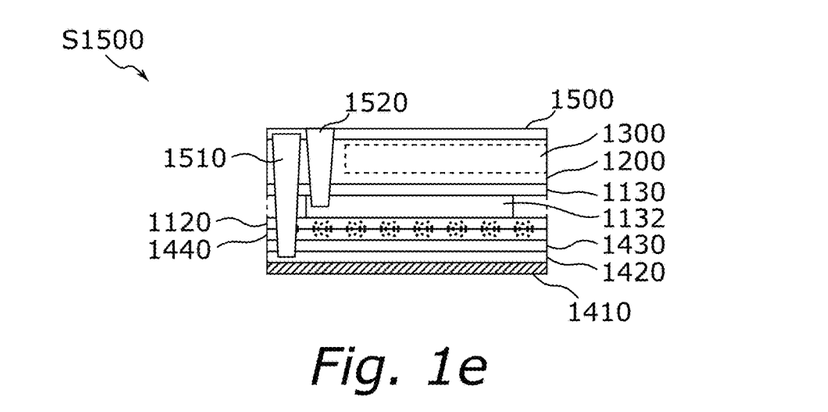

FIG. 1e illustrates schematically an optional further step S1500, wherein the III-V semiconductor layer stack 1200 and the GaN-based device layer structure 1300 therein are further processed in order to create a GaN-based device in the GaN-based device layer structure 1300. This may include, e.g., performing various front-end of line (FEOL) processing steps, such as patterning of the device layer structure 1300, forming shallow trench isolation (STI), gate formation, among other processes to define one or more active areas of the GaN-based device. This may also include performing various BEOL processing steps to provide a BEOL interconnect structure 1500 also for the GaN-based device, including, e.g., contacts, routings and similar required for the GaN-based device to function properly. This may further include, e.g., forming various vias 1510 electrically connecting, e.g., the BEOL interconnect structure 1500 to the BEOL interconnect structure 1430 and the active device layer 1420 originally belonging to the second wafer 1400. In addition, if, e.g., one or more metal layers 1132 are included for heat redistribution (such as shown in FIG. 1e, and as, e.g., provided in the second alternative third substep S1121 of the step of forming the first wafer 1100), thermal vias 1520 may be provided for extracting heat from such one or more metal layers 1132.

Figure 1F:
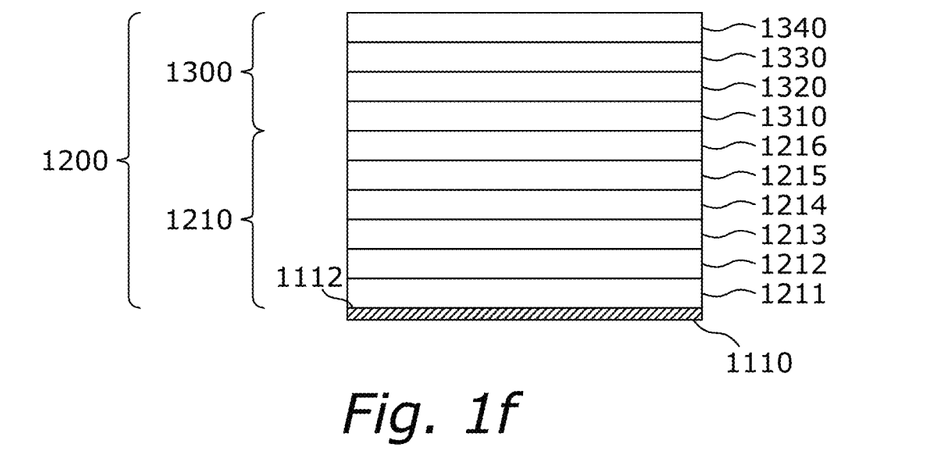

FIG. 1f illustrates schematically an example of a III-V semiconductor layer stack 1200 as grown on the first substrate 1110 of the first wafer 1100, before providing the first bonding layer 1120 and before the bonding in step S1300 and the thinning S1401 in step S1400. The stack 1200 includes an AlN layer 1211. The AlN layer 1211 may, for example, have a thickness of approximately 200 nm. The stack 1200 includes one or more AlN/AlGaN transition layers 1212. A thickness of the transition layers 1212 may, for example, be approximately 1.2 µm. In one example, the stack 1200 can include a carbon-doped $Al_{0.08}Ga_{0.92}N$ layer 1213. A thickness of the layer 1213 may for example be approximately 1 µm. The stack 1200 includes a carbon-doped GaN layer 1214. A thickness of the layer 1214 may for example be approximately 1 µm. The stack 1200 may further include one or more etch stop layers 1215 and 1216. In the example illustrated in FIG. 1f, the etch stop layer 1215 can be a $Al_{0.35}Ga_{0.65}N$ layer, with a thickness of for example approximately 0.05 µm. The etch stop layer 1216 is an AlN layer, with a thickness of, for example, approximately 2 nm. Together, the layers 1211 to 1216 form a buffer layer structure 1210. In some embodiments, the etch stop layers (e.g., the layers 1215 and 1216) may instead not form part of the buffer layer structure 1210, but be separate layers provided between the buffer layer structure 1210 and the GaN-based device layer structure 1300. The buffer layer structure 1210 may be removed during thinning of the first wafer 1100 during step S1400. The etch stop layers may, for example, help to obtain a more uniform thickness of, e.g., a GaN channel layer 1310 (as will be described below) after the etch is completed. It is envisaged that a buffer layer structure may also have other, or same but differently arranged, layers than those illustrated as layers 1211 to 1214

(or 1211 to 1216). The functionality of the buffer layer structure shall in any way be such that it handles, e.g., a mismatch of lattice constants between the first substrate 1110 and the one or more layers of the GaN-based device layer structure 1300.

The III-V semiconductor layer stack 1200 includes the GaN-based device layer structure 1300. The structure 1300 includes a GaN channel layer 1310. The channel layer 1310 may, e.g., be undoped, and have a thickness of between approximately 10 to 100 nm. The structure 1300 includes an AlN spacer layer 1320, with a thickness of approximately 1 nm. The layer 1320 may be optional. Further, the structure 1300 can include a $Al_{0.35}Ga_{0.65}N$ layer 1330. A thickness of the layer 1330 may for example be approximately 0.025 µm. The structure 1300 also includes a further GaN layer 1340. The layer 1340 may, e.g., be undoped, and have a thickness of between approximately 50 to 200 nm. The layers 1320 and 1330 may form part of a barrier layer structure, and be provided between the GaN channel layer 1310 and the first bonding layer 1120 (not shown in FIG. 1f). Such a barrier layer structure may, for example, serve to help contain a two-dimensional electron gas (2 DEG) at the interface between the barrier layer structure and the GaN channel layer 1310, if the GaN-based device layer structure 1300 is to be formed into, e.g., a HEMT or MOSHEMT device. The further GaN layer 1340 may serve as, or form part of, a stress layer structure provided between the barrier layer structure and the first bonding layer 1120. Such a stress layer structure may help to keep the layers (e.g., the layers 1320 and 1330) of the barrier layer structure stressed also after transferring during the bonding step S1300. In some embodiments, the layer 1330 may instead be an InAlN layer instead of an AlGaN layer. It is envisaged that an InAlN layer in the barrier layer structure may offer, e.g., a lower sheet resistance. An InAlN layer may also be lattice matched to GaN. Thinning of the first wafer 1100 may include removing, e.g., the first substrate 1110 and the buffer layer structure 1210, thereby exposing a surface of the GaN channel layer 1310. Depending on what type of GaN-based device that is to be fabricated in the GaN-based device layer structure, it is of course envisaged that the GaN-based device layer structure 1300 may include other, or same but differently arranged, layers than the layers 1310, 1320, 1330 and 1340.

Figure 1G:
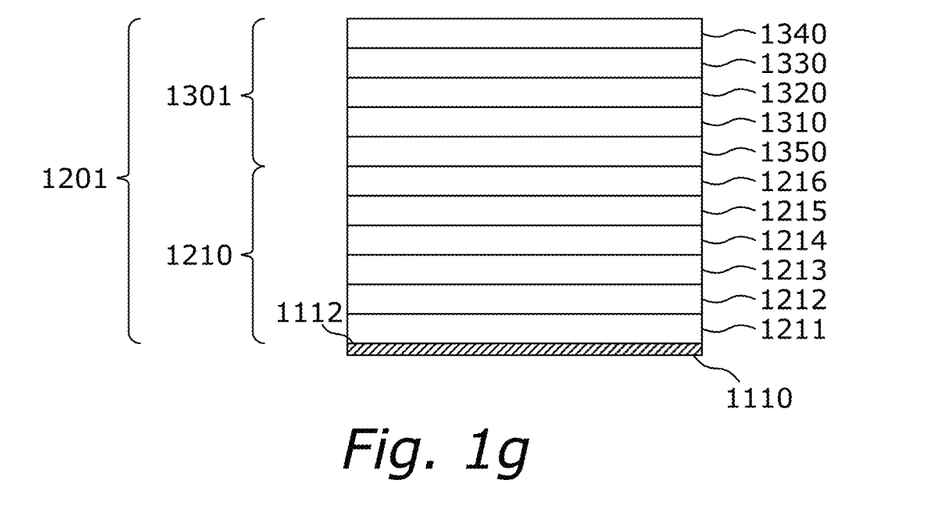

FIG. 1g illustrates schematically an alternative example of a III-V semiconductor layer stack 1201 similar to the stack 1200 described with reference to FIG. 1f. In the stack 1201, the GaN-based device layer structure 1301 includes an additional InGaN layer 1350, arranged between the GaN channel layer 1310 and the buffer layer structure 1210. The layer 1350 may be a doped layer (e.g., n+ doped), and be used for forming source and/or drain contacts of the GaN channel layer 1310. A thickness of the layer 1350 may, for example, be approximately 50 nm.

Figure 2A:
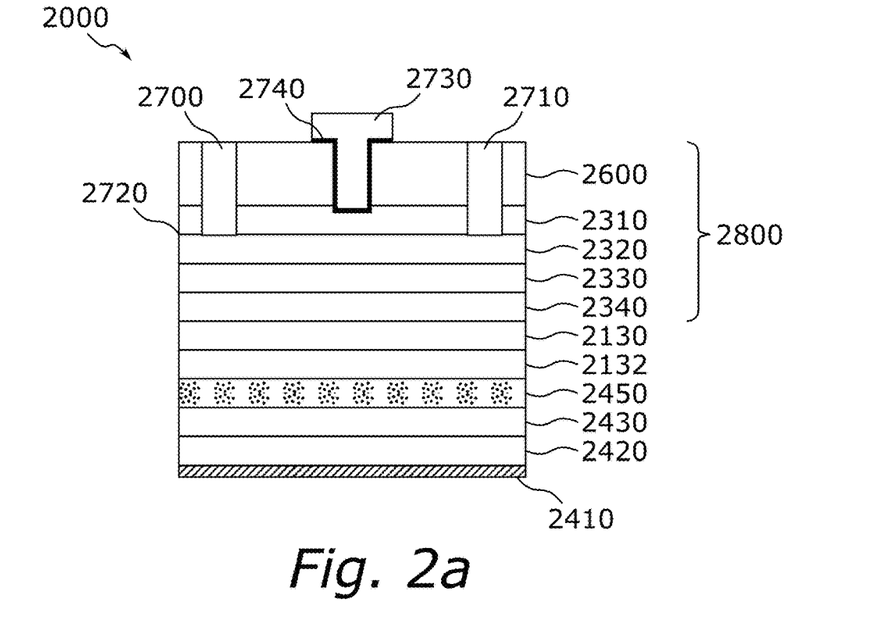
Figure 2B:
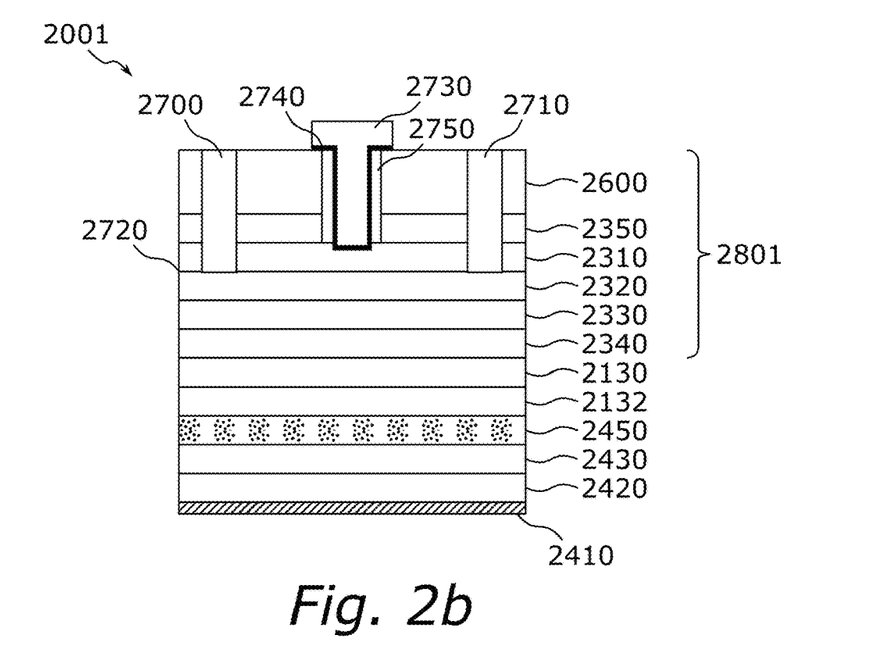

With reference to FIGS. 2a and 2b, various embodiments of a semiconductor device according to the disclosed technology will now be described in more detail.

FIG. 2a illustrates schematically a semiconductor device 2000 according to one embodiment. The device 2000 includes a substrate 2410 (which may correspond to the second substrate 1410), preferably a Si substrate, on which an active device layer structure in form of a CMOS device layer 2420 is formed. The CMOS device layer 2420 may for example be or include a CMOS transistor, and correspond to the active device layer 1420. There is also provided a BEOL interconnect structure 2430 on the CMOS device layer 2420. As described earlier herein, although not visible in FIG. 2a, the BEOL interconnect structure 2430 may of course extend into the CMOS device layer 2420, in order to provide the contacts and routings for the CMOS device (such as, e.g., a CMOS transistor) to function properly and communicate with the rest of the device 2000. The BEOL interconnect structure 2430 may correspond to the structure 1430. The CMOS device layer 2420 may for example be provided on a Si substrate 2410 having a (100) surface orientation.

A bonding stack 2450 is provided on the BEOL interconnect structure 2430. The bonding stack 2450 may for example be formed by bonding two bonding layers together, such as done when bonding the bonding layers 1120 and 1440 in the method described earlier herein.

A heat redistribution metal layer 2132 and an electrically insulating layer 2130 are provided on the bonding stack 2450. The heat redistribution metal layer 2132 may, e.g., correspond to the metal layer 1132. The electrically insulating layer 2130 may, e.g., be a protection oxide/nitride, and correspond to the layer 1130.

An undoped GaN layer 2340 (approximately 50-200 nm thick) is provided on the electrically insulating layer 2130. The layer 2340 may, e.g., correspond to the layer 1340. In one example, a barrier layer structure including an $Al_{0.35}Ga_{0.65}N$ layer 2330 (approximately 0.025 µm thick, or an InAlN layer as described earlier herein) and an AlN spacer layer 2320 (approximately 1 nm thick) may be provided on the layer 2340. The layers 2330 and 2320 may correspond, e.g., to the layers 1330 and 1320, respectively. The GaN layer 2340 may form part of a stress layer structure, similar to the stress layer structure described with reference to, e.g., FIG. 1f. On top of the spacer layer 2320 is provided an undoped GaN channel layer 2310 (approximately 10-50 nm thick). The GaN channel layer (or simply GaN channel) 2310 may, e.g., correspond to the GaN channel (layer) 1310.

An oxide layer 2600 (e.g., a $SiO_2$ layer) is provided on the GaN channel layer 2310. Source and drain metal stacks 2700 and 2710 are provided through the oxide layer 2600, and contacts the GaN channel layer 2310 and a 2 DEG 2720 formed at the interface between the barrier layer structure and the GaN channel layer 2310. A gate metal 2730 is also provided through the oxide layer 2600, and separated from the oxide layer 2600 and the GaN channel layer 2310 with the help of a gate dielectric 2740. The gate 2730 may be recessed partly into the GaN channel layer 2310, in order to bring the gate 2730 closer to the 2 DEG 2720. The layers 2340, 2330, 2320, 2310, the source and drain metal stacks 2700 and 2710, the gate 2730 and gate dielectric 2740 together forms part of a MOSHEMT 2800, cointegrated with the CMOS device layer 2420. The 2 DEG 2720 may be modulated by application of a gate bias using the gate 2730. A turn-on voltage of the transistor 2800 may be negative, as the channel formed by the 2 DEG 2720 is already present when zero gate bias is applied. Turning off the transistor 2800 may require a negative gate bias.

Due to orientation of the GaN channel layer 2310, such as obtained by the use of a method as described herein, the MOSHEMT 2800 is N-polar. This in contrast to other transistors, such as provided by conventional HEMT stack formation on a Si substrate, and not as formed by a method as described herein. In such other (HEMT) transistors, the direction of layers will be reversed, such that, e.g., the barrier layer structure will above (e.g., further from the substrate than) the GaN channel. This results in the 2 DEG being formed above the GaN channel, and in a Ga-polar growth of, e.g., the interfaces. This may result from, e.g., a spontaneous and piezoelectric polar nature of the bonding of the Group III and nitrogen materials.

It may be envisaged that, e.g., the gate dielectric 2740 is not provided, and that the device 2800 is instead a HEMT.

FIG. 2b illustrates schematically an alternative embodiment of a semiconductor device 2001. The device 2001 is similar to the device 2000 described with reference to FIG. 2a, but with the HEMT 2801 including an additional layer 2350 of doped InGaN in between the GaN channel layer 2310 and the oxide layer 2500. The layer 2350 may correspond, e.g., to the layer 1350 described with reference to FIG. 1g, and have a thickness of for example approximately 50 nm. The layer 2350 may, e.g., function as a doped source-drain contacting layer, in contact with the GaN channel layer. Additional, inner spaces 2750 are also provided between the gate dielectric 2740 and, e.g., the oxide layer 2600 and the layer 2350.

As the main channel current does not flow at the gate dielectric interface, the devices 2000 and 2001 may help to achieve a high or very high electron mobility (e.g., >1000 cm$^2$/Vs). Additional, as no buffer layers (such as the buffer layer structure 1210) remains after thinning, degradation of the performance of the devices due to various traps in the buffer regions may also be avoided.

In general, the disclosed technology provides a way of integrating a GaN based device together with a CMOS based device on a Si substrate. This without requiring additional transfer wafers/substrates, and/or without multiple bonding steps. The disclosed technology also provides a semiconductor device, e.g., a MOSHEMT or HEMT. The method may be used to perform parts of the manufacturing process of such a device, and the resulting arrangement of the various layers provides a barrier layer structure below the GaN channel, and thus a 2 DEG formed below the GaN channel, and results in such a device being N-polar instead of Ga-polar.

The person skilled in the art realizes that the disclosed technology is by no means limited to the embodiments described above. On the contrary, many modifications and variations are possible within the scope of the appended claims.

Although features and elements are described above in particular combinations, each feature or element may be used alone without the other features and elements or in various combinations with or without other features and elements.

Additionally, variations to the disclosed embodiments can be understood and effected by the skilled person in practicing the claimed invention, from a study of the drawings, the disclosure, and the appended claims. In the claims, the word "comprising" does not exclude other elements, and the indefinite article "a" or "an" does not exclude a plurality. The mere fact that certain features are recited in mutually different dependent claims does not indicate that a combination of these features cannot be used to advantage.

What is claimed is:

1. A method of forming a semiconductor device, the method comprising:
    forming a first wafer comprising, on a front side thereof, a III-V semiconductor layer stack formed on a first substrate a first bonding layer, and a barrier layer structure between the III-V semiconductor layer stack and the first bonding layer, the III-V semiconductor layer stack comprising a GaN-based device layer structure formed on the first substrate and comprising a GaN channel layer;
    subsequent to forming the first wafer, bonding the first bonding layer to a second bonding layer of a second wafer, the second wafer comprising a second substrate supporting an active device layer, a back-end of line (BEOL) interconnect structure and the second bonding layer; and
    subsequent to bonding, thinning the first wafer from a backside thereof, wherein thinning comprises removing at least the first substrate.

2. The method of claim 1, wherein the III-V semiconductor layer stack comprises a buffer layer structure between the first substrate and the GaN-based device layer structure, and wherein thinning includes removing the buffer layer structure.

3. The method of claim 2, wherein the III-V semiconductor layer stack comprises one or more etch stop layers between the buffer layer structure and the GaN-based device layer structure.

4. The method of claim 1, wherein the method further comprises, subsequent to thinning, processing the GaN-based device layer structure to form a transistor device.

5. The method of claim 1, wherein the barrier layer structure comprises at least an AlGaN layer.

6. The method of claim 1, wherein the barrier layer structure comprises at least an InAlN layer.

7. The method of claim 1, wherein the first wafer includes a stress layer structure between the barrier layer structure and the first bonding layer, the stress layer structure comprising a GaN layer.

8. The method of claim 1, wherein the GaN-based device layer structure comprises a doped source-drain contacting layer in contact with the GaN channel layer, and wherein thinning comprises exposing the doped source-drain contacting layer.

9. The method of claim 1, wherein the first wafer comprises a metal layer between the GaN-based device layer structure and the first bonding layer, and further comprises an electrically insulating layer between the metal layer and the GaN-based device layer structure.

10. The method of claim 9, wherein the method further comprises forming, subsequent to bonding, one or more thermal vias connecting to the metal layer.

11. The method of claim 1, wherein the method further comprises, subsequent to bonding, forming one or more vias connecting to the BEOL interconnect structure.

12. The method of claim 1, wherein the first substrate comprises a Si substrate having a (111) surface orientation.

13. A semiconductor device, comprising:
    a silicon substrate;
    an active device layer formed on the substrate;
    a back-end-of-line (BEOL) interconnect structure formed on the active device layer;
    an N-polar high-electron-mobility transistor (HEMT) bonded via a bonding stack to the interconnect structure and comprising an N-polar GaN channel;
    a metal layer between the bonding stack and the HEMT; and
    an electrically insulating layer between the metal layer and the HEMT.

14. The semiconductor device of claim 13, wherein the HEMT is a metal-oxide-semiconductor HEMT.

15. The semiconductor device of claim 13, wherein a gate of the HEMT is recessed into the N-polar GaN channel.

* * * * *

UNITED STATES PATENT AND TRADEMARK OFFICE
CERTIFICATE OF CORRECTION

| | |
|---|---|
| PATENT NO. | : 11,322,390 B2 |
| APPLICATION NO. | : 16/844845 |
| DATED | : May 3, 2022 |
| INVENTOR(S) | : Amey Mahadev Walke |

It is certified that error appears in the above-identified patent and that said Letters Patent is hereby corrected as shown below:

In the Claims

Column 9, Claim 1, Line 59, delete "substrate" and insert --substrate,--.

Signed and Sealed this
Twenty-first Day of March, 2023

Katherine Kelly Vidal
*Director of the United States Patent and Trademark Office*